(12) United States Patent
Sadeghian Marnani et al.

(10) Patent No.: US 12,724,038 B2
(45) Date of Patent: Sep. 1, 2026

(54) GRID PLATE ENCODER BASED POSITIONING SYSTEM AND METHOD

(71) Applicant: Nearfield Instruments B.V., Rotterdam (NL)

(72) Inventors: Hamed Sadeghian Marnani, Rotterdam (NL); Ioan-Andrei Toacsen, Eindhoven (NL)

(73) Assignee: Nearfield Instruments B.V., Rotterdam (NL)

( * ) Notice: Subject to any disclaimer, the term of this patent is extended or adjusted under 35 U.S.C. 154(b) by 333 days.

(21) Appl. No.: 18/272,640

(22) PCT Filed: Jan. 24, 2022

(86) PCT No.: PCT/NL2022/050031

§ 371 (c)(1),
(2) Date: Jul. 17, 2023

(87) PCT Pub. No.: WO2022/158980

PCT Pub. Date: Jul. 28, 2022

(65) Prior Publication Data

US 2024/0295583 A1 Sep. 5, 2024

(30) Foreign Application Priority Data

Jan. 25, 2021 (NL) ...................................... 2027376

(51) Int. Cl.
*G01Q 20/02* (2010.01)
*G01Q 30/06* (2010.01)
(Continued)

(52) U.S. Cl.
CPC ............. *G01Q 20/02* (2013.01); *G01Q 30/06* (2013.01); *G01Q 40/00* (2013.01); *G01Q 70/02* (2013.01);
(Continued)

(58) Field of Classification Search
CPC ........ G01Q 20/02; G01Q 30/06; G01Q 40/00; G01Q 70/02; G03F 9/7061;
(Continued)

(56) References Cited

U.S. PATENT DOCUMENTS

2007/0227273 A1 10/2007 Layton et al.
2008/0021813 A1 1/2008 Simpson et al.
(Continued)

FOREIGN PATENT DOCUMENTS

EP 2682759 A1 1/2014
EP 3599470 A1 1/2020
(Continued)

OTHER PUBLICATIONS

Ekberg, Peter et al., "A new general approach for solving the self-calibration problem on large area 2D ultra-precision coordinate measurement machines," Meas. Sci. Technol. 25, 11 pgs, (2014).
(Continued)

*Primary Examiner* — Georgia Y Epps
*Assistant Examiner* — Erin R Garber
(74) *Attorney, Agent, or Firm* — Banner & Witcoff, Ltd.

(57) ABSTRACT

A grid plate encoder based positioning system (1) for positioning of an element is provided, the positioning system (1) comprises

- a grid plate (2) with a grid plate surface (21);
- an encoder unit (3) with one or more optical sensors (31) for sensing a grid plate surface pattern (23) of the grid plate surface (21);
- an input (7) to receive coordinates (Xd, Yd) specifying a desired position of the element;
- a mapping unit (8) to compute compensated coordinate data (Xa, Ya) corresponding to estimated position data expected from the encoder unit (3) when the element is positioned at a desired position (Xd, Yd) specified by the setpoint coordinates;

(Continued)

a feedback control unit (9) providing the compensated coordinate data (Xa, Ya) as a setpoint (Xs, Ys) to a positioning unit (12), with feedback control based on the estimated position data obtained from the encoder unit.

Additionally, a grid plate encoder based positioning method and a method for computing compensation data are provided.

18 Claims, 3 Drawing Sheets

(51) Int. Cl.

*G01Q 40/00* (2010.01)
*G01Q 70/02* (2010.01)
*G03F 9/00* (2006.01)

(52) U.S. Cl.

CPC .. *G03F 9/7061* (2013.01); *G05B 2219/37224* (2013.01)

(58) Field of Classification Search

CPC .. G03F 7/70775; G03F 7/7085; G03F 9/7019; G03F 9/7003; G03F 9/7007; G05B 19/401; G05B 2219/37008; G05B 2219/37098; G05B 2219/37119; G05B 2219/37162; G05B 2219/37177; G05B 2219/37224; G05B 2219/37517; G05B 2219/41207; G05B 2219/45182; G05B 19/27; G05B 19/19

See application file for complete search history.

(56) References Cited

U.S. PATENT DOCUMENTS

2008/0105026 A1 5/2008 Loopstra et al.
2010/0296071 A1* 11/2010 Shibazaki ............. G03F 7/7085 359/566
2014/0204392 A1* 7/2014 Lee ..................... G03F 7/70775 356/500
2015/0160564 A1* 6/2015 Balan .................. G03F 7/70775 355/72
2015/0185248 A1* 7/2015 Sadeghian Marnani .................... G01Q 70/06 850/3
2016/0245843 A1 8/2016 Shioda et al.
2019/0287837 A1* 9/2019 Ichinose ................... G03F 1/42
2020/0004166 A1* 1/2020 Aoki ................... G03F 7/70758

FOREIGN PATENT DOCUMENTS

JP 2010-62208 A 3/2010
JP 2011038851 A 2/2011
JP 5257832 B2 8/2013
WO 2016030090 3/2016
WO WO-2016030090 A1 * 3/2016 ............. G01D 18/00

OTHER PUBLICATIONS

Torralba, Marta et al., “Geometrical Characterisation of a 2D Laser System and Calibration of a Cross-Grid Encoder by Means of a Self-Calibration Methodology,” Sensors, 16 pgs., (2017).

International Search Report and Written Opinion—PCT/NL2022/050031—mailing date May 10, 2022.

* cited by examiner

GRID PLATE ENCODER BASED POSITIONING SYSTEM AND METHOD

CROSS-REFERENCE TO RELATED APPLICATIONS

This application is a U.S. National Stage application under 35 U.S.C. § 371 of International Application PCT/NL2022/050031 (published as WO 2022/158980 A1), filed Jan. 24, 2022, which claims the benefit of priority to Application NL 2027376, filed Jan. 25, 2021. Each of these prior applications is hereby incorporated by reference in its entirety.

BACKGROUND

The present invention pertains to a grid plate encoder based positioning system.

The present invention further pertains to a method of positioning an element.

The present invention further pertains to a method of computing compensation data for positioning.

The present invention still further pertains to a record carrier comprising a computer program with instructions to enable a programmable processor to perform one or more steps of either of the methods.

Various production and quality inspection systems require a highly accurate positioning of a production system element or an inspection system element relative to a product to be processed. Examples thereof are systems for manufacturing electronic, optic or opto-electric products at a nano-scale.

Positioning systems are known that use a flat 2D encoder scale, also denoted as grid plate, in combination with an encoder head assembly. A encoder head assembly may comprise a plurality of encoder read heads, for example a first, a second and a third 1D encoder read head. A combination of three 1D encoder read heads, of which at least two have a mutually different decoding direction can be used to determine the position of the encoder head assembly in 3 degrees of freedom (DOF), i.e. X, Y, Rz. A grid plate is typically provided with a two-dimensional periodic pattern e.g. providing reflecting grid lines on a non-reflective background or reversely. By way of example the encoder head assembly may have one 1D-encoder read head for the X-direction and have two 1D-encoder read heads for the Y-direction. Examples of commercially available grid encoders are KGM 181, KGM 182, KGM 281, KGM 282 available from Heidenhain.

Depending on the patterning method, the gridplate pattern will have manufacturing imperfections. The manufacturing imperfection will lead to signal imperfections, limiting the accuracy of the position signal obtained from the encoder. Accordingly, there is a need for measures enabling an improved accuracy.

SUMMARY

According to a first aspect of the invention, an improved grid plate encoder based positioning system for positioning of an element is provided. The grid plate encoder based positioning system comprises:

- a grid plate with a grid plate surface;
- an encoder unit with one or more optical sensors for sensing a grid plate surface pattern of the grid plate surface;
- an input to receive coordinates specifying a desired position of the element;
- a mapping unit to compute compensated coordinate data corresponding to estimated position data expected from the encoder unit when the element is positioned at a desired position specified by the setpoint coordinates;
- a feedback control unit providing the compensated coordinate data as a setpoint to a positioning unit, with feedback control based on the estimated position data obtained from the encoder unit.

The combination of the encoder unit and grid plate can be selected from commercially available products as specified above for example. Even in the presence of manufacturing imperfections in the grid plate, the improved position system provides for an accurate positioning of an element in that the mapping unit takes into account deviations in the estimated position data resulting from the imperfections.

A compensation table may be used for computing compensated coordinate data corresponding to estimated position data expected from the encoder unit when the element is positioned at the desired position specified by the setpoint coordinates. Interpolation may be applied to compute interpolated compensated coordinate data for desired positions having coordinate values other than those stored in the compensation table. In alternative embodiments, a polynomial is used to compute compensated coordinate data from data specifying a desired position.

In an embodiment, the grid plate encoder based positioning system further comprises:

- a wafer stage for carrying a wafer having optically detectable marks at a wafer surface facing the grid plate surface;
- a calibration head movable between the wafer stage and the grid plate, the calibration head including an encoder unit with one or more optical sensors for sensing the grid plate surface pattern of the grid plate surface and a mark sensor for sensing optically detectable mark at a reference wafer carried by the wafer stage;
- a calibration head positioning unit to position the calibration head at a plurality of mutually different lateral positions and a calibration control unit to control the calibration head positioning unit and to compute compensation data for use by the mapping unit from measurement data obtained from the further encoder unit and from the mark sensor at the plurality of mutually different lateral positions.

In a calibration stage, the calibration head positioning unit positions the calibration head at a plurality of mutually different lateral positions distributed in the X, Y-plane defined parallel to the grid plate and defined by the marks at the surface of the reference wafer. At each of these positions sense data is obtained from the mark sensor and from the encoder unit. The sense data obtained from the mark sensor is considered as indicating the true position of the calibration head. Accordingly, each pair of mark sensor data and encoder sensor data provides an indication of the position as estimated by the encoder using the possibly imperfect grid plate at the position indicated by the mark sensor. The data so obtained can be used to provide a compensation table that for each of the mutually different lateral positions has a table entry which is addressable with the position indicated by the mark sensor and comprises the data specifying the corresponding, possibly deviating, position as estimated by the encoder. Additional further table entries may be provided by interpolation, e.g. bilinear interpolation, of the table entries specifically obtained for the mark positions. Additionally or alternatively, subsequent to the calibration stage, an interpolation may be applied to compensation table data. In other embodiments the mark sensor data and encoder sensor data obtained in the calibration stage is used to compute a polynomial that specifies a relationship between the position expected as the estimated position for each actual position in the spatial range defined by the grid.

The reference wafer to be used for sensing by the mark sensor may be specifically designed for this purpose. However, alternatively, a customer wafer may be used as the reference wafer, provided that it has the optically detectable marks, such as typical alignment markers at its surface. A reference wafer may further comprise a fiducial to obtain a reference position. Alternatively or additionally the wafer stage may be provided with a fiducial.

The mark sensor may comprise an off the shelf camera available for this purpose and including an objective, tube lens, camera, objective actuation mechanism for focusing on the wafer, wafer illumination and the like. By way of example a Basler acA4024-29 um USB 3.0 camera may be used for this purpose.

It is noted that once calibration is completed, the elements specifically involved for calibration may be removed and reused for other purposes. Therewith the calibration head, the calibration head positioning unit, and the calibration control unit, are no essential components in the calibrated positioning system. Also the wafer stage may be absent, unless the positioning system is comprised in a wafer handling system.

For example, in an embodiment, the grid plate encoder based positioning system is comprised in an atomic force microscope (AFM) system for inspection of a wafer. The AFM further comprises an AFM head with a probe having a tip to be positioned with the positioning system, wherein the AFM head includes the encoder unit. In operation, the positioning unit positions the AFM head at the position where the encoder unit indicates the coordinates corresponding to the compensated coordinates from the compensation unit.

According to a second aspect of the invention, an improved method of positioning an element is provided that comprises:

- providing a grid plate with a grid plate surface;
- providing an encoder unit with one or more optical sensors for sensing a grid plate surface pattern of the grid plate surface;
- receive coordinates specifying a desired position of the element;
- computing compensated coordinate data corresponding to estimated position data expected from the encoder unit when the element is positioned at the desired position specified by the setpoint coordinates;
- using feedback control to position the element at a position where the estimated coordinate data of the encoder unit correspond to the computed compensated coordinate data.

According to a third aspect a method of computing compensation parameters for use with a respective grid plate in a grid plate encoder based positioning system using a grid plate having a grid plate surface with a surface pattern, is provided. The method comprises:

- providing a reference wafer having optically detectable marks at a wafer surface facing the grid plate surface;
- providing a calibration head between the grid plate and the reference wafer, the calibration head having a mark sensor facing said waver surface and having at least the one or more optical sensors of a grid encoder facing the grid plate surface;
- positioning the calibration head at a plurality of laterally different positions of the calibration head between the grid plate and the reference wafer to obtain a respective position indication from the mark sensor indicative for its sensed position with respect to the optically detectable marks, and to obtain a respective encoder position indication from the encoder indicative for its position with respect to the grid plate surface; and
- computing compensation parameters based on the obtained position indications.

BRIEF DESCRIPTION OF THE DRAWINGS

These and other aspects are described in more detail with reference to the drawings. Therein.

DETAILED DESCRIPTION OF EMBODIMENTS

Figure 1:
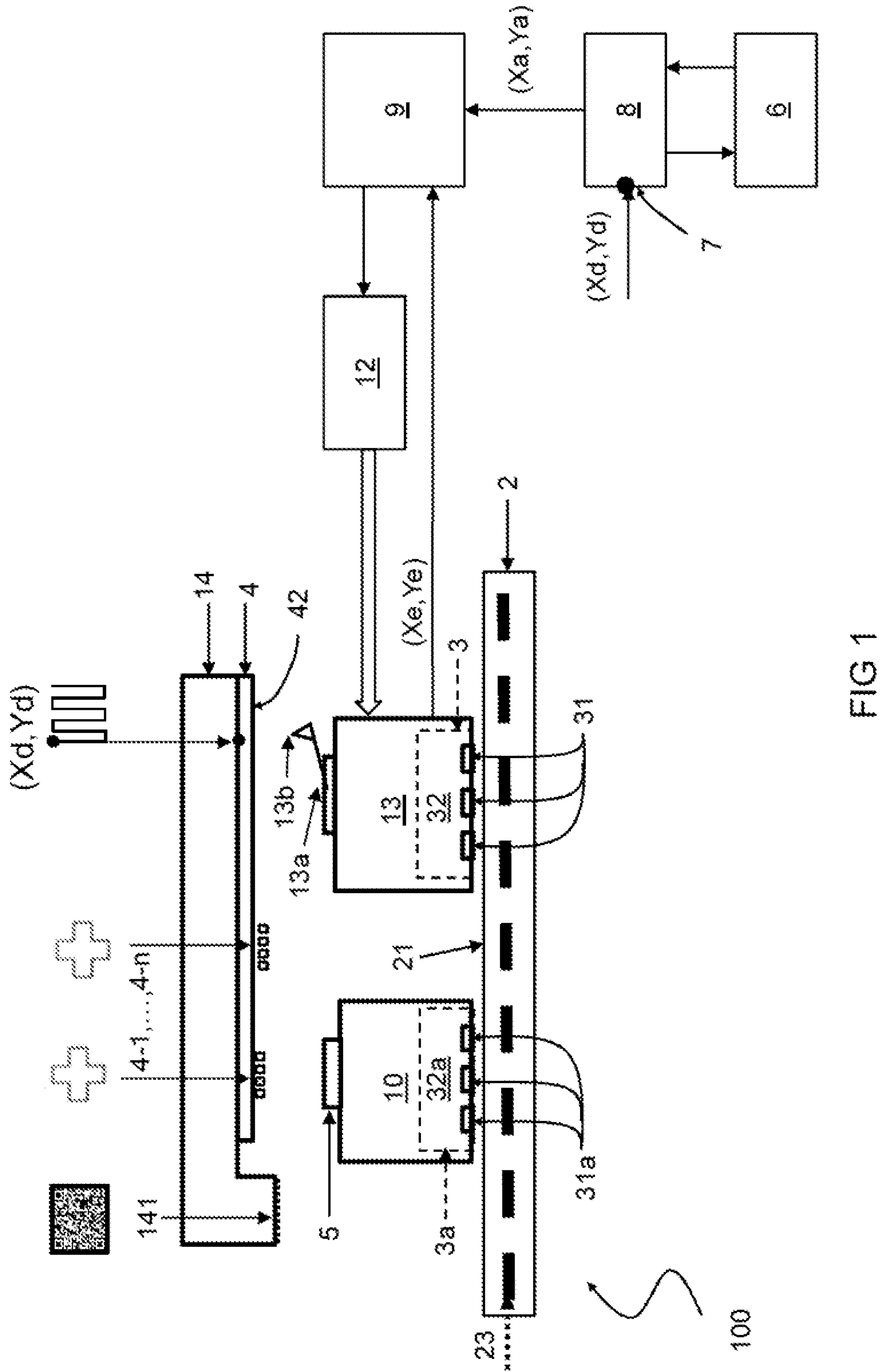
FIG. 1 schematically shows a grid plate encoder based positioning system.

FIG. 1 schematically shows a grid plate encoder based positioning system 1 for positioning of an element. In the embodiment shown, the positioning system 1 is part of an atomic force microscope system AFM 100. The element to be positioned therein is a tip 13*b* at a probe 13*a* of an AFM head 13. In other examples, the element to be positioned may be a production system element. The positioning system 1 comprises a grid plate 2, an encoder unit 3, a specified coordinate input 7, a compensation table 6, a mapping unit 8, a feedback control unit 9 and a positioning unit 12.

The input 7 is provided to receive coordinates (Xd, Yd) specifying a desired position of the element 13*b* with respect to a surface 42 of a customer wafer 4 that is carried by a wafer stage 14. The encoder unit 3 is part of the AFM head 13 and comprises one or more optical sensors 31 and a signal processor 32 to enable the encoder unit to estimate a position of the encoder unit 3 with respect to a grid plate surface 21 of the grid and provide estimated coordinates (Xe, Ye) thereof. Alternatively, processing of the signals from the encoder sensors 31 may take place remote from the AFM head. The grid plate 2 has a grid plate surface 21 with a grid plate surface pattern 23 indicated by a thick dashed line. Due to imperfections in the grid plate surface pattern 23, the estimated coordinates may deviate from the true coordinates of the encoder unit 3.

The mapping unit 8 uses the compensation table 6 to compute compensated coordinate data (Xa, Ya) that corresponds to the estimated position data that is expected from the encoder unit 3 when the element is positioned at the desired position (Xd, Yd) that is specified by the setpoint coordinates. In case the encoder unit 3 in the AFM head does not include a signal processor 32, the mapping unit 8 may have a signal processing module to provide the estimated coordinates from the sense signals of the optical sensors 31.

The feedback control unit 9 provides the compensated coordinate data (Xa, Ya) as a setpoint (Xs, Ys) to the positioning unit 12 and uses feedback control to achieve the position that is indicated by the encoder unit 3 with estimated coordinates corresponding to the compensated coordinate data (Xa, Ya). Therewith, despite imperfections in the grid plate surface pattern 23, the actual the probe tip 13*b* is positioned by the positioning unit 12 at the position indicated by the desired position (Xd, Yd).

As shown in FIG. 1, the grid plate encoder based positioning system incorporated in the atomic force microscope system AFM 100 additionally comprises a calibration head 10 that is equipped with another encoder unit 3*a* as well as a mark sensor 5.

Figure 2:
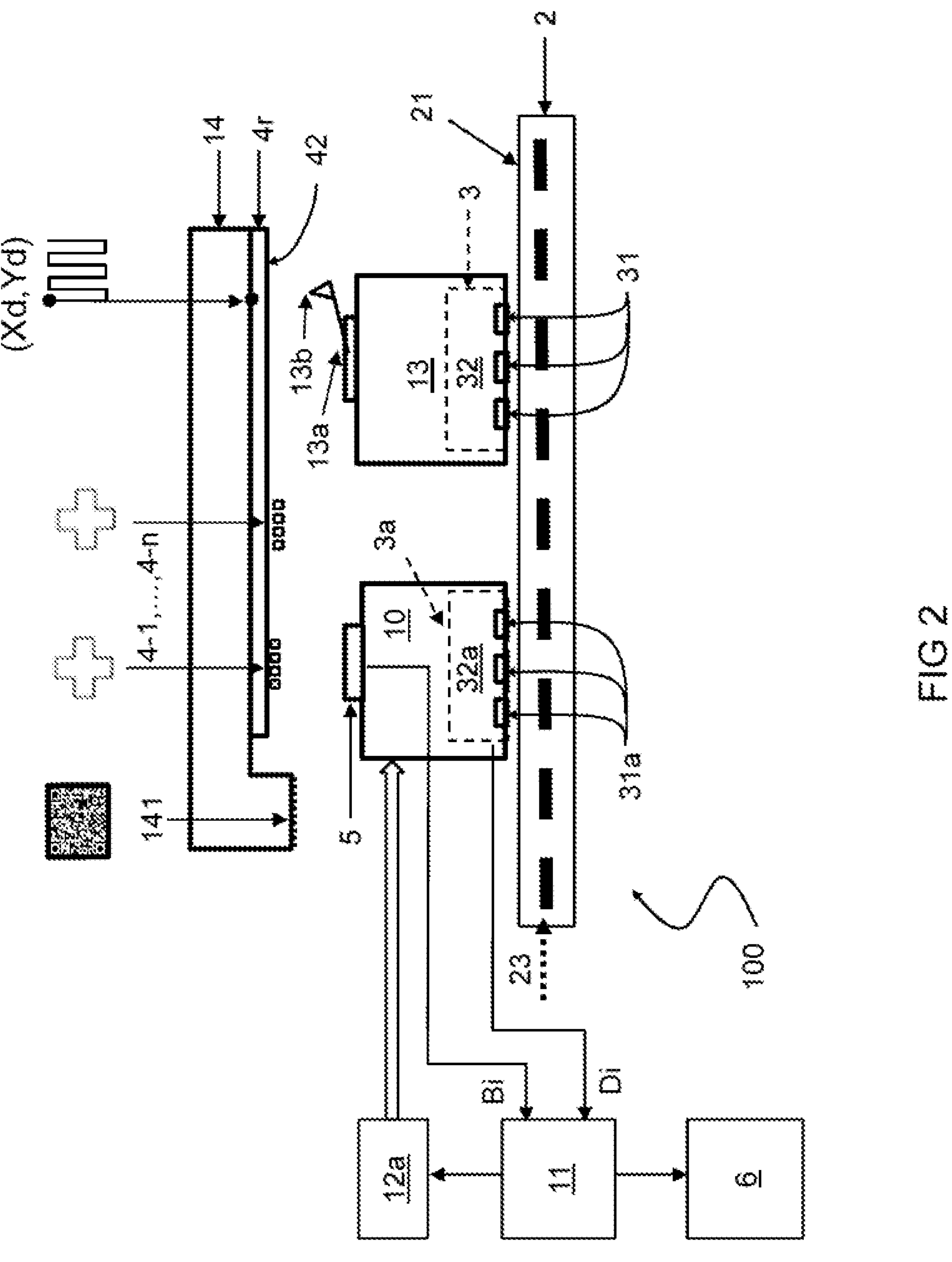
FIG. 2 shows further details of the grid plate encoder based positioning system of FIG. 1.

As shown further in FIG. 2, the grid plate encoder based positioning system comprises a calibration head positioning unit 12*a* and a calibration control unit 11. For clarity the elements involved in positioning the AFM head 13, apart from the compensation table 6, are not shown.

Figure 3:
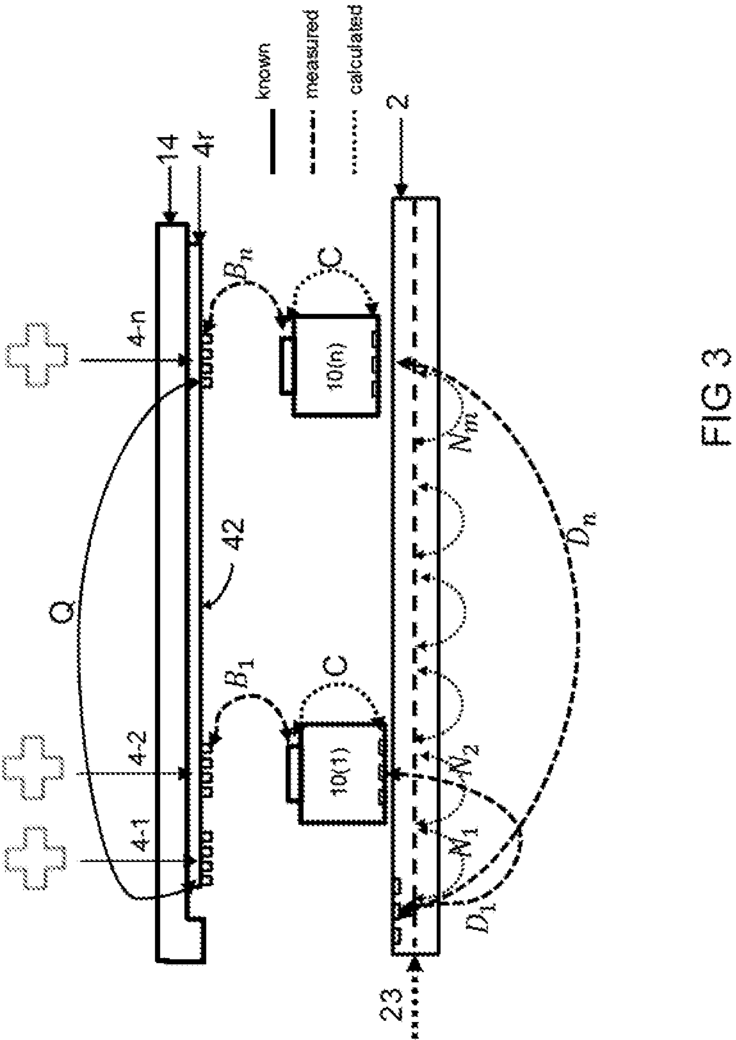
FIG. 3 shows aspects of a method of computing a compensation table for use in the grid plate encoder based positioning system.

FIG. 2 in combination with FIG. 3 also schematically shows a method of computing the compensation table 6 for use with the grid plate 2 in the grid plate encoder based positioning system 1. The method comprises the following steps.

A reference wafer 4*r* having a wafer surface 42 with optically detectable marks 4-1, 4-2, . . . , 4-*n* is provided that faces the grid plate surface 21.

A calibration head 10 is provided between the grid plate 2 and the reference wafer 4*r*. The calibration head 10 has a mark sensor 5 that faces the waver surface and that has at least the one or more optical sensors 31 of a grid encoder facing the grid plate surface 21.

As shown in more detail in FIG. 2, in the configuration so obtained, the calibration head 10 is subsequently positioned at a plurality of laterally different positions (j=1, . . . , n) between the grid plate 2 and the reference wafer 4. At each of the laterally different positions a respective mark sensor position indication Bj of the mark sensor 5 and a respective encoder position indication Dj of the encoder is obtained. The mark sensor position indication Bj indicates a sensed position of the mark sensor with respect to the optically detectable marks 41 on the wafer surface 42 and the encoder position indication Dj indicates a sensed position of the encoder with respect to the grid plate surface 21. A respective calibration parameter Nj for the compensation table 6 is computed for each pair of a mark sensor position indication Bj and an encoder position indication Dj.

In FIG. 3 schematically shows the calibration head 10 at a first position as 10(1) and at an n-th position as 10(*n*). Furthermore, FIG. 3 shows the known distance Q between the first mark 4-1 and the last mark 4-*n*. The value C represents the position of mark sensor with respect to the encoder. Grid map calibration parameters N1-Nm determined from the n-measurements. The calibration parameters N1-Nm are for example respective entries in a compensation table, wherein each table entry is addressable as a desired position and comprises the data specifying the corresponding, possibly deviating, position as estimated by the encoder. The table entries N1-Nm may comprise n entries that are directly obtained from the n-measurements, i.e. each of the positions indicated by the mark sensor is used as an address for a table entry and the position indicated by the encoder is stored in the entry with that address. In addition m-n additional entries in the table may be computed by interpolation. In case the resolution with which the desired position is specified exceeds the resolution of the table 6, compensated coordinate data may be computed by interpolation of table data for desired positions that do not have an entry in the table. In an alternative embodiment, the grid map calibration parameters N1-Nm are parameters specifying a polynomial that specifies the compensated coordinate data as a function of the desired coordinate data.

It will be appreciated that the method may include computer implemented steps. All above mentioned steps can be computer implemented steps, for example to be executed by a dedicated signal processor, a configurable signal processor, a general purpose processor or a combination of processors. Various embodiments may be implemented using hardware elements, software elements, or a combination of both. Examples of hardware elements may include processors, microprocessors, circuits, application specific integrated circuits (ASIC), programmable logic devices (PLD), digital signal processors (DSP), field programmable gate array (FPGA), logic gates, registers, semiconductor device, microchips, chip sets, et cetera. Examples of software may include software components, programs, applications, computer programs, application programs, system programs, machine programs, operating system software, mobile apps, middleware, firmware, software modules, routines, subroutines, functions, computer implemented methods, procedures, software interfaces, application program interfaces (API), methods, instruction sets, computing code, computer code, et cetera.

The invention also extends to computer programs, particularly computer programs on or in a carrier, adapted for putting the invention into practice. The program may be in the form of source or object code or in any other form suitable for use in the implementation of the processes according to the invention. The carrier may be any entity or device capable of carrying the program. For example, the carrier may comprise a storage medium, such as a ROM, for example a semiconductor ROM or hard disk. Further, the carrier may be a transmissible carrier such as an electrical or optical signal which may be conveyed via electrical or optical cable or by radio or other means, e.g. via the internet or cloud.

Some embodiments may be implemented, for example, using a machine or tangible computer-readable medium or article which may store an instruction or a set of instructions that, if executed by a machine, may cause the machine to perform a method and/or operations in accordance with the embodiments.

Herein, the invention is described with reference to specific examples of embodiments of the invention. It will, however, be evident that various modifications, variations, alternatives and changes may be made therein, without departing from the essence of the invention. For the purpose of clarity and a concise description features are described herein as part of the same or separate embodiments, however, alternative embodiments having combinations of all or some of the features described in these separate embodiments are also envisaged and understood to fall within the framework of the invention as outlined by the claims. The specifications, figures and examples are, accordingly, to be regarded in an illustrative sense rather than in a restrictive sense. The invention is intended to embrace all alternatives, modifications and variations which fall within the spirit and scope of the appended claims. Further, many of the elements that are described are functional entities that may be implemented as discrete or distributed components or in conjunction with other components, in any suitable combination and location.

In the claims, any reference signs placed between parentheses shall not be construed as limiting the claim. The word 'comprising' does not exclude the presence of other features or steps than those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to an advantage.

The invention claimed is:

1. A grid plate encoder based positioning system for positioning of an element, the positioning system comprising:

a grid plate with a grid plate surface;

an encoder unit with one or more optical sensors for sensing a grid plate surface pattern of the grid plate surface; and an input to receive setpoint coordinates specifying a desired position of the element;

wherein said positioning system is configured to:

compute compensated coordinate data corresponding to estimated position data expected from the encoder unit when the element is positioned at the desired position; and provide the compensated coordinate data as a setpoint to a positioning unit, with feedback control based on the estimated position data obtained from the encoder unit, the positioning system further comprising:

a wafer stage for carrying a wafer having optically detectable marks at a wafer surface facing the grid plate surface;

a calibration head movable between the wafer stage and the grid plate, the calibration head including the encoder unit with the one or more optical sensors for sensing the grid plate surface pattern of the grid plate surface and a mark sensor for sensing the optically detectable marks;

wherein the calibration head is configured for being positioned at a plurality of mutually different lateral positions and wherein the positioning system is further configured to compute the compensated coordinate data from measurement data obtained from the encoder unit and from the mark sensor at the plurality of mutually different lateral positions.

2. An atomic force microscope (AFM) system comprising the grid plate encoder based positioning system according to claim 1, further comprising an AFM head with a probe having a tip to be positioned with the positioning system, wherein the AFM head includes the encoder unit.

3. A method of positioning the element with the grid plate encoder based positioning system according to claim 1, the method comprising:

providing the setpoint coordinates indicative of the desired position of the element;

computing the compensated coordinate data indicative for the estimated position data expected from the encoder unit when the element is positioned at the desired position;

providing the compensated coordinate data as the setpoint to the positioning unit, with feedback control based on the estimated position data obtained from the encoder unit.

4. The grid plate encoder based positioning system according to claim 1, wherein the compensated coordinate data are computed using a compensation table.

5. A production system comprising the grid plate encoder based positioning system according to claim 4, further comprising a production system element to be positioned with the positioning system.

6. The grid plate encoder based positioning system according to claim 1, wherein the positioning system is further configured to determine a plurality of grid map calibration parameters.

7. The grid plate encoder based positioning system according to claim 6, wherein the plurality of grid map calibration parameters are respective entries in a compensation table, wherein each table entry is addressable as the desired position and comprises the estimated position data.

8. The grid plate encoder based positioning system according to claim 7, wherein the compensation table comprises further entries, wherein position indications from the mark sensor specify respective addresses for the further entries, and the estimated position data indicated by the encoder unit are stored in the further entries having the respective addresses.

9. The grid plate encoder based positioning system according to claim 8, wherein additional entries in the compensation table are computed by interpolation.

10. The grid plate encoder based positioning system according to claim 6, wherein the plurality of grid map calibration parameters define a polynomial that specifies the compensated coordinate data as a function of the setpoint coordinates specifying the desired position of the element.

11. The grid plate encoder based positioning system according to claim 1, wherein the encoder unit further comprises a plurality of encoder read heads.

12. The grid plate encoder based positioning system according to claim 11, wherein the plurality of encoder read heads comprises a first, a second and a third 1D encoder read head.

13. The grid plate encoder based positioning system according to claim 12, wherein the first 1D-encoder read head is for a first planar direction and the second and the third 1D encoder read heads are for a Y-direction.

14. The grid plate encoder based positioning system according to claim 11 wherein the grid plate surface pattern is provided with a two-dimensional periodic pattern comprising reflecting grid lines on a non-reflective background or reversely.

15. A production system comprising the grid plate encoder based positioning system according to claim 1, further comprising a production system element to be positioned with the positioning system.

16. A method of positioning an element, comprising:

providing a grid plate with a grid plate surface;

providing an encoder unit with one or more optical sensors for sensing a grid plate surface pattern of the grid plate surface;

receiving setpoint coordinates specifying a desired position of the element;

computing compensated coordinate data corresponding to estimated position data expected from the encoder unit when the element is positioned at the desired position;

using feedback control to position the element where the estimated position data correspond to the compensated coordinate data, wherein the method further comprises:

providing a wafer stage for carrying a wafer having optically detectable marks at a wafer surface facing the grid plate surface;

providing a calibration bead movable between the wafer stage and the grid plate, the calibration head including the encoder unit with the one or more optical sensors for sensing the grid plate surface pattern of the grid plate surface and a mark sensor for sensing the optically detectable marks, wherein the calibration head is configured for being positioned at a plurality of mutually different lateral positions, and wherein the compensated coordinate data is computed from measurement data obtained from the encoder unit and from the mark sensor at the plurality of mutually different lateral positions.

17. A non-transitory computer readable medium having instructions to enable a programmable processor to perform one or more steps of the method of claim 16.

18. A method of computing compensation parameters for use with a grid plate in a grid plate encoder based positioning system, the grid plate having a grid plate surface with a surface pattern, the grid plate encoder based positioning system comprising an encoder unit with one or more optical sensors for optically sensing the surface pattern at the grid plate surface and a signal processor for computing estimated position data from sense signals obtained from said one or more optical sensors; the method comprising:

providing a reference wafer having optically detectable marks at a wafer surface facing the grid plate surface;

providing a calibration head between the grid plate and the reference wafer, the calibration head having a mark sensor facing said wafer surface and having at least the one or more optical sensors of the encoder unit facing the grid plate surface;

positioning the calibration head at a plurality of laterally different positions between the grid plate and the reference wafer to obtain respective position indications from the mark sensor indicative for its sensed position with respect to the optically detectable marks, and to obtain a respective encoder position indication from the encoder unit indicative for its position with respect to the grid plate surface; and computing the compensation parameters based on the position indications.

* * * * *